(12) United States Patent
Fober et al.

(10) Patent No.: US 11,092,702 B1
(45) Date of Patent: Aug. 17, 2021

(54) PARTICLE BEAM SYSTEM AND METHOD OF OPERATING A PARTICLE BEAM SYSTEM

(71) Applicant: Carl Zeiss Microscopy GmbH, Jena (DE)

(72) Inventors: Jörg Fober, Heuchlingen (DE); Judith Kimling, Aalen (DE); Wolfgang Berger, Gerstetten (DE); Stefan Meyer, Aalen (DE); Björn Gamm, Koenigsbronn (DE)

(73) Assignee: Carl Zeiss Microscopy GmbH, Jena (DE)

( * ) Notice: Subject to any disclaimer, the term of this patent is extended or adjusted under 35 U.S.C. 154(b) by 209 days.

(21) Appl. No.: 16/570,440

(22) Filed: Sep. 13, 2019

(51) Int. Cl.
*H01J 37/244* (2006.01)
*G01T 1/29* (2006.01)
*G01T 7/00* (2006.01)
*G01T 1/28* (2006.01)

(52) U.S. Cl.
CPC .............. *G01T 1/2992* (2013.01); *G01T 1/28* (2013.01); *G01T 7/005* (2013.01); *H01J 37/244* (2013.01)

(58) Field of Classification Search
CPC ......... G01T 1/28; G01T 1/2992; G01T 7/005; H01J 37/244
See application file for complete search history.

(56) References Cited

U.S. PATENT DOCUMENTS

| 7,649,220 | B2 | 1/2010 | Chen et al. |
| 2010/0020933 | A1 | 1/2010 | Topfer et al. |
| 2010/0245378 | A1 | 9/2010 | Matsuura |
| 2019/0355545 | A1* | 11/2019 | Zeidler .................. H01J 37/05 |

FOREIGN PATENT DOCUMENTS

JP          5460103 B2     4/2014

* cited by examiner

*Primary Examiner* — Mark R Gaworecki
(74) *Attorney, Agent, or Firm* — Fish & Richardson P.C.

(57) ABSTRACT

A particle beam system is configured to perform a method which includes: preventing at least one of generation of induced particles and incidence of the induced particles onto a detection area of a detector configured to output a detection signal; generating a residual signal by processing the detection signal outputted during the preventing using a control value; adjusting, based on the residual signal, the control value so that the residual signal takes a value within a predetermined limited residual-signal target range; directing a primary particle beam onto an object while allowing generation of the induced particles due to the primary particle beam and incidence of the induced particles onto the detection area; generating a result signal by processing the detection signal outputted during the directing using the control value.

21 Claims, 6 Drawing Sheets

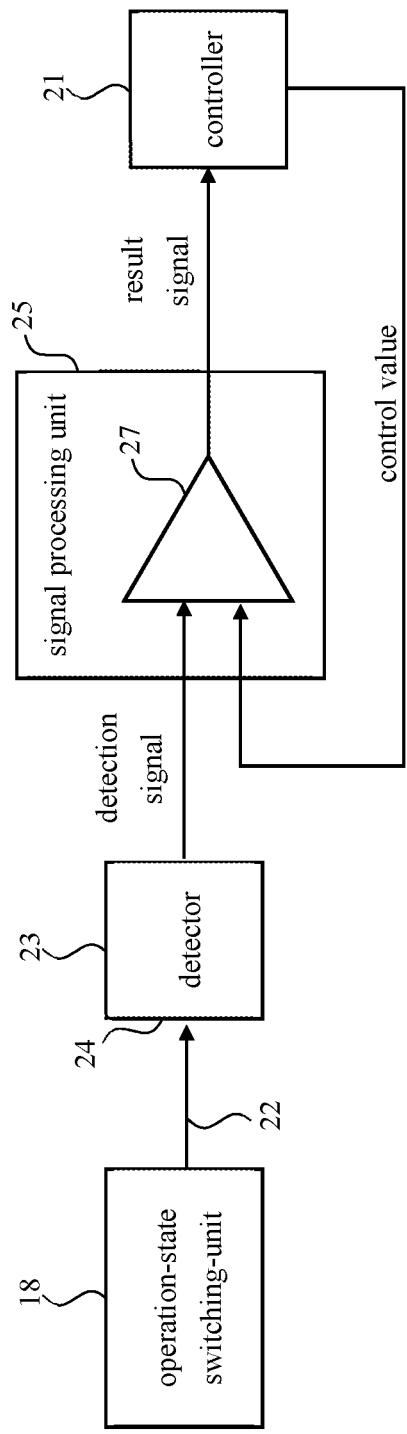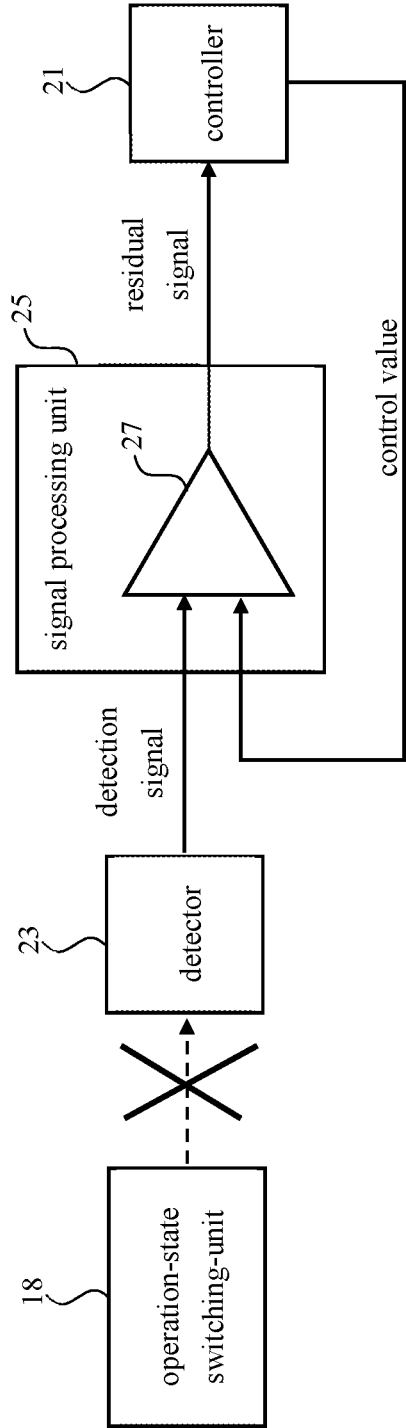
Fig. 2A
Fig. 2B

PARTICLE BEAM SYSTEM AND METHOD OF OPERATING A PARTICLE BEAM SYSTEM

FIELD

The present disclosure relates to a particle beam system and a method of operating a particle beam system. In particular, the present disclosure relates to an electron beam system and an ion beam system and methods of operating the same.

BACKGROUND

A particle beam system for analyzing an object often includes a particle beam column configured to generate a primary particle beam and to direct the primary particle beam onto the object to be analyzed. Particles of the primary particle beam interact with the object. Due to the interaction, particles emerge from the object. The particles emerging from the object due to the interaction of the primary particle beam with the object are referred to as induced particles. Induced particles can be scattered electrons (including scattered primary electrons), backscattered electrons, secondary electrons, scattered ions (including scattered primary ions), backscattered ions, secondary ions, photons (radiation, such as X-rays and/or cathodoluminescence), and combinations thereof. These induced particles can be detected by a detector. The detector detects the induced particles incident onto a detection area of the detector and outputs a detection signal intended to represent an amount of particles detected per unit of time, an energy spectrum of the particles and the like.

By scanning the primary particle beam across an object and simultaneously detecting the induced particles using the detector, the detection signal can be obtained for a plurality of locations of the object.

Based on the detection signal thus obtained, multiple different types of analysis results can be obtained. For example, an image of the object representing a spatial distribution of the amount of particles emerging from the object due to the scanning can be obtained. Also, energy spectra for a plurality of locations of the object can be obtained to determine a chemical and/or structural composition of the object.

The detector can be a semiconductor detector. In particular, a bias can be applied to the detector in order to reduce the amount of energy desired to trigger a detection event, or in order to increase the bandwidth and decrease the noise of the detection signal.

When induced particles are incident onto the detection area of the detector, the detection signal includes a residual contribution and a particle-based contribution. The particle-based contribution is the desired information such as the amount of induced particles per unit of time, an energy spectrum of the induced particles and the like.

However, such detectors can sometimes output a detection signal indicating detected particles even in a situation in which actually no induced particles are incident onto the detection area of the detector. Herein, the contribution to the detection signal in the absence of induced particles incident onto the detection area is referred to as the residual contribution. The residual contribution may have different causes, one of which is the temperature of the detector. The temperature of the detector and its environment provide thermal energy which can trigger a detection event even in a situation in which actually no induced particles are incident onto the detection area of the detector. As the temperature of the environment and the detector generally change over time, the temperature-specific contribution to the residual contribution generally varies over time.

SUMMARY

Analysis results (e. g. images, energy spectra and the like) based on the detection signal itself are generally of poor quality when the residual contribution is of the same order of magnitude as the particle-based contribution. In general, the quality is also poor when the residual contribution changes over time. Particle beam systems that do not account for the residual contribution to the detection signal and may provide analysis results of poor quality under the circumstances described above.

Therefore, the present disclosure seeks to provide a particle beam system and a method of operating a particle beam system which provide analysis results of better quality. For example, the present disclosure seeks to provide a particle beam system and a method of operating a particle beam system which reduce the influence of the time dependency of the residual contribution on the quality of the analysis results.

The present disclosure relates to a particle beam system. The particle beam system includes: a particle beam column configured to generate a primary particle beam and scan the primary particle beam across an object region; a detector configured to detect induced particles incident onto a detection area of the detector and to output a detection signal based on the detected induced particles; an operation-state switching-unit configured to selectively operate in an allowing state and a preventing state, wherein the operation-state switching-unit operating in the allowing state is configured to allow generation of the induced particles by the primary particle beam and incidence of the induced particles onto the detection area, wherein the operation-state switching-unit operating in the preventing state is configured to prevent at least one of generation of the induced particles and incidence of the induced particles onto the detection area; a signal processing unit configured to generate a result signal by processing, using a control value, the detection signal outputted while the operation-state switching-unit is operating in the allowing state and to generate a residual signal by processing, using the control value, the detection signal outputted while the operation-state switching-unit is operating in the preventing state; and a controller configured to control operation of the operation-state switching-unit and the signal processing unit; wherein the controller is further configured to record data representing the result signal; and wherein the controller is further configured to adjust, based on the residual signal, the control value so that the residual signal takes a value within a predetermined limited residual-signal target range. The present disclosure further relates to a method of operating a particle beam system.

The method includes: preventing at least one of generation of induced particles and incidence of the induced particles onto a detection area of a detector configured to detect the induced particles and to output a detection signal based on the detected induced particles; generating a residual signal by processing the detection signal outputted during the preventing using a control value; adjusting, based on the residual signal, the control value so that the residual signal takes a value within a predetermined limited residual-signal target range; directing a primary particle beam onto an object while allowing generation of the induced particles due to the primary particle beam and incidence of the induced particles onto the detection area; generating a result signal by processing the detection signal outputted during the directing using the control value; and recording data representing the result signal.

According to the particle beam system and the method, the residual signal substantially represents the residual contribution to the detection signal. The residual signal is used to obtain a control value accounting for the residual contribution. The control value is used when generating the result signal in order to control the residual contribution to the result signal, thereby providing a more accurate measurement. For example, the control value can be controlled so that the residual contribution to the result signal is substantially constant over time, thereby eliminating the influence of the time dependency of the residual contribution on the result signal.

BRIEF DESCRIPTION OF THE DRAWINGS

The forgoing as well as other advantageous features of the disclosure will be more apparent from the following detailed description of exemplary embodiments with reference to the accompanying drawings. It is noted that not all possible embodiments necessarily exhibit each and every, or any, of the advantages identified herein.

FIG. 2A shows a schematic signal processing performed by the particle beam system when the operation-state switching-unit is operating in the allowing state.

FIG. 2B shows a schematic signal processing performed by the particle beam system when the operation-state switching-unit is operating in the preventing state.

DETAILED DESCRIPTION OF EXEMPLARY EMBODIMENTS

Figure 1:
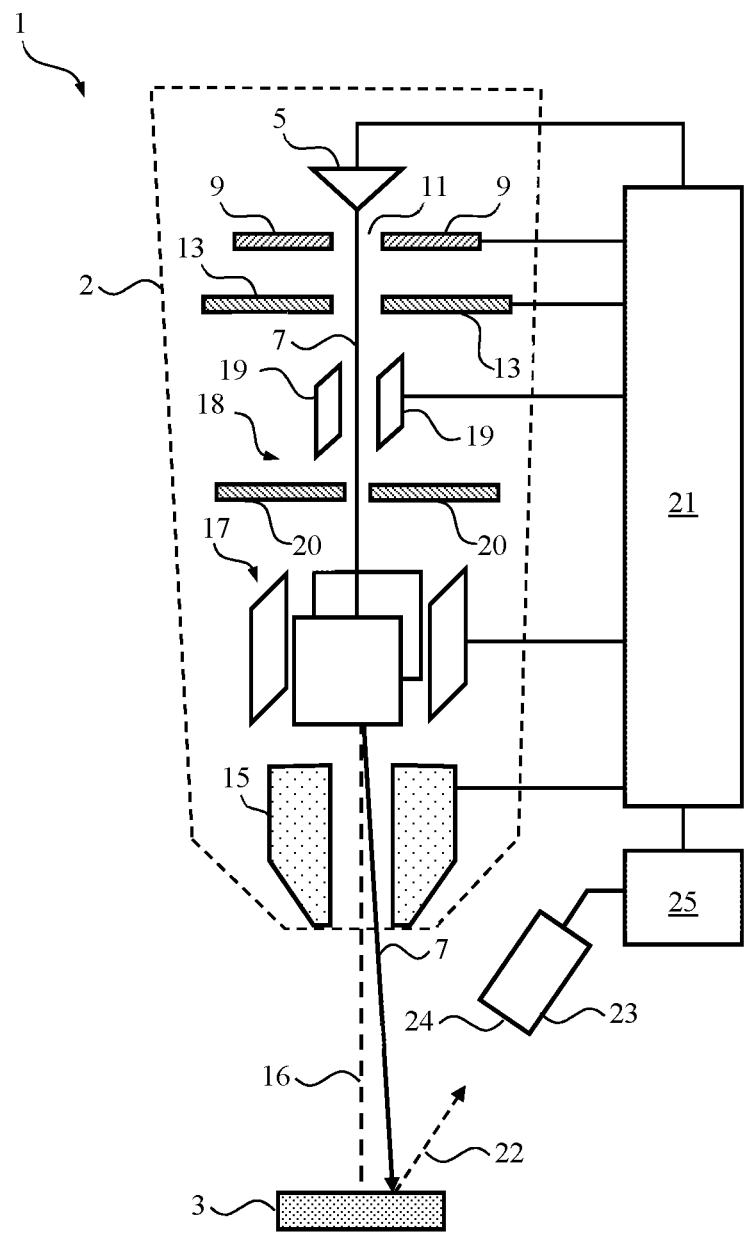
FIG. 1 shows a schematic illustration of a particle beam system according to a first embodiment.

In the exemplary embodiments described below, components that are alike in function and structure are designated as far as possible by alike reference numerals. Therefore, to understand the features of the individual components of a specific embodiment, the descriptions of other embodiments and of the summary of the disclosure should be referred to.

FIG. 1 shows a schematic illustration of a particle beam system 1 according to a first embodiment. The particle beam system 1 is configured to perform the methods described herein.

The particle beam system 1 is configured to generate a primary particle beam 7 and to scan the primary particle beam 7 across an object region, thereby generating induced particles 22 emerging from the object region. The object region is a spatial region where an object 3 to be analyzed can be located. The primary particle beam 7 can be formed from charged particles, such as electrons and ions, or from photons, i. e. radiation, for example. Without prejudice, the following description is directed to a particle beam system providing a primary beam of charged particles. Depending on the type of particles of the primary particle beam 7 and their energy upon incidence onto the object 3, the induced particles 22 can be scattered electrons, in particular scattered primary electrons, backscattered electrons, secondary electrons, scattered ions, in particular scattered primary ions, backscattered ions, secondary ions, photons, i. e. radiation (e. g. X-rays, cathodoluminescence), and combinations thereof, for example.

The particle beam system 1 can be implemented as an electron beam system such as an electron microscope, in particular a scanning electron microscope, and a transmission electron microscope. In this case, the primary particle beam 7 in formed by electrons.

Further, the particle beam system 1 can be implemented as an ion beam system, in particular a focus ion beam (FIB) system. In this case, the primary particle beam 7 in formed by ions.

Even further, the particle beam system 1 can be implemented as a system including multiple particle beam columns, wherein the multiple particle beam columns are configured to generate multiple primary particle beams having a common working region. The multiple primary particle beams can be of different type, e.g., a system can include an electron beam column for generating a primary electron beam and an ion beam column for generating a primary ion beam.

The particle beam system 1 includes a particle beam column 2. The particle beam column 2 includes a particle source 5 configured to generate the primary particle beam 7. The particle beam column 2 further includes a suppression electrode 9 to which an electric potential can be applied so that only such particles generated by the particle source 5 having a sufficiently large kinetic energy can pass through an opening 11 in the suppression electrode 9.

The particle beam column 2 further includes an acceleration electrode 13 to which an electric potential can be applied to accelerate the particles passing the opening 11 of the suppression electrode 9 to a predetermined kinetic energy.

The particle beam column 2 further includes a particle optical lens 15 configured to focus the primary particle beam 7 in the object region.

The particle beam column 2 further includes a deflection system 17 configured to deflect the primary particle beam 7 so that the primary particle beam 7 can be directed to different locations on the surface of the object 3. The deflection system 17 can be configured to deflect the primary particle beam 7 along two directions oriented orthogonal to each other, the two directions further being oriented orthogonal to a main axis 16 of the particle optical lens 15.

The particle beam system 1 further includes a controller 21 configured to control the particle beam column 2 and its individual components such as the particle source 5, the electric potential applied to the suppression electrode 9, the electric potential applied to the acceleration electrode 13, the particle optical lens 15 and the deflection system 17.

The particle beam system 1 further includes a detector 23 configured to detect the induced particles 22 incident onto a detection area 24 of the detector 23. The detector 23 is further configured to output a detection signal based on the detected induced particles. The detection signal can represent the amount of induced particles 22 detected per unit of time, an energy spectrum of the detected induced particles 22 and the like. The detector 23 can be disposed outside or inside the particle beam column 2.

The particle beam system 1 further includes an operation-state switching-unit 18 controlled by the controller 21. The operation-state switching-unit 18 can operate in an allowing state and in a preventing state. In particular, the controller 21 can control the operation-state switching-unit 18 to selectively operate in the allowing state and the preventing state.

When operating in the allowing state, the operation-state switching-unit 18 allows generation of the induced particles 22 by the primary particle beam 7 and (simultaneously) allows incidence of the induced particles 22 generated by the primary particle beam 7 onto the detection area 24 of the detector 23. In substance, when the operation-state switching-unit 18 is operating in the allowing state, the primary particle beam 7 can be incident onto the object 3, whereby the induced particles 22 are generated, and the induced particles 22 can be incident onto the detection area 24 of the detector 23.

When operating in the preventing state, the operation-state switching-unit 18 prevents either the generation of the induced particles 22 by the primary particle beam 7 or incidence of the induced particles 22 generated by the primary particle beam 7 onto the detection area 24 of the detector 23 or both. In substance, when the operation-state switching-unit 18 is operating in the preventing state, the induced particles 22 cannot be incident onto the detection area 24 because the generation of the induced particles 22 is prevented and/or because incidence of the (eventually generated) induced particles 22 onto the detection area 24 is prevented.

In the example illustrated in FIG. 1, the operation-state switching-unit 18 is exemplified by a beam blanker configured to selectively blank (i.e. block) and unblank (i.e. not block) the primary particle beam 7. The beam blanker 18 is a fast switch allowing and preventing the primary particle beam 7 to be incident onto the object 3. In the allowing state, the beam blanker does not blank the primary particle beam 7 so that the primary particle beam 7 can be incident onto the object 3 in the object region, thus allowing generation of the induced particles 22 and allowing incidence of the thus generated induced particles 22 onto the detection area 24. In the preventing state, the beam blanker blanks the primary particle beam 7 so that the primary particle beam 7 cannot be incident onto the object 3 in the object region, thus preventing generation of the induced particles 22.

As illustrated in FIG. 1, the beam blanker can be implemented by a deflector 19 and an aperture 20 having an opening. The deflector 19 is configured to deflect the primary particle beam 7. Depending on the deflecting, the primary particle beam 7 either passes the opening in the aperture 20 disposed downstream the deflector 19 or is blocked by the aperture 20. In the allowing state, the deflector 19 is controlled so that the primary particle beam 7 passes the opening in the aperture 20 and is incident onto the object 3, thereby allowing generation of the induced particles 22. In the preventing state, the deflector 19 is controlled so that the primary particle beam 7 is deflected to be blocked by the aperture 20, thereby preventing generation of the induced particles 22.

The particle beam system 1 further includes a signal processing unit 25. The signal processing unit 25 is configured to receive the detection signal outputted by the detector 23, to process the detection signal using a control value provided by the controller 21, and to output the signal thus obtained to the controller 21.

FIG. 2A shows a schematic signal processing performed by the particle beam system 1 when the operation-state switching unit 18 is operating in the allowing state.

When operating in the allowing state, the operation-state switching-unit 18 allows generation of the induced particles 22 and incidence of the induced particles 22 onto the detection area 24 of the detector 23. Accordingly, the detector 23 outputs the detection signal including a particle-based contribution caused by the induced particles 22 detected by the detector 23 and a residual contribution. The detection signal is input into the signal processing unit 25.

The signal processing unit 25 can be dedicated hardware for processing the detection signal. The signal processing unit 25 can be an analog circuit providing fast signal processing. However, the signal processing unit 25 can also be part of the controller 21 and be at least partially implemented through software sacrificing processing speed.

In the example illustrated in FIG. 2A, the signal processing unit 25 is considered dedicated hardware including an analog amplifier 27. The detection signal is input into an input terminal of the amplifier 27. A control value provided by the controller 21 is input into another input terminal of the amplifier 27. The amplifier 27 is configured to output an amplified difference between the signals provided at its input terminals. Accordingly, the amplifier 27 outputs an amplified difference between the detection signal and the control value.

The signal processing unit 25 is configured to generate a result signal based on the output of the amplifier 27. In particular, the signal processing unit 25 is configured to generate the result signal based on the amplified difference between the detection signal and the control value. The signal processing unit 25 outputs the result signal to the controller 21 and the controller can be configured to further process the result signal, for example for recording data representing the result signal or a signal derived from the result signal. The recording can be achieved by storing the result signal or the derived signal in a memory.

The signal processing unit 25 can include several more and different components. For example, instead or in addition to the amplifier 27, the signal processing unit 25 can include a difference calculation unit configured to output a difference between the detection signal and the control value, wherein the result signal is based on an output of the difference calculation unit. For example, the signal processing unit can include an analog-to-digital converter configured to digitize the detection signal and/or an output of the difference calculation unit and/or the amplifier 27. For example, the signal processing unit 25 can include a communication unit configured to transmit a signal generated by the processing unit 25 to another device such as the controller 21.

Even when the induced particles 22 are allowed to be incident onto the detection area 24 and the induced particles 22 are detected by the detector 23, the detection signal can be small. Therefore, the signal processing unit 25 provides the amplifier 27 in order to amplify the detection signal.

FIG. 2B shows a schematic signal processing performed by the particle beam system 1 when the operation-state switching-unit 18 is operating in the preventing state. When operating in the preventing state, the operation-state switching-unit 18 is operated so that no induced particles 22 are incident onto the detection area 24, either by preventing generation of the induced particles 22 or by preventing incidence of the induced particles 22 onto the detection area 24 or both. Referring to FIG. 1, in which the operation-state switching-unit 18 is implemented as a beam blanker, this situation is realized by controlling the beam blanker so that the primary particle beam 7 does not pass the opening in the aperture 20 but is blocked by the aperture 20, thereby preventing generation of the induced particles 22.

The signal processing illustrated in FIG. 2B corresponds to the signal processing illustrated in FIG. 2A, however instead of referring to the signal outputted by the signal processing unit 25 as the result signal, the output of the signal processing unit 25 is referred to as residual signal. Accordingly, both the result signal and the residual signal are generated in the same way, the only difference being that for generating the result signal, the operation-state switching-unit 18 is operating in the allowing state, whereas for generating the residual signal, the operation-state switching-unit 18 is operating in the preventing state.

In the situation illustrated in FIG. 2B, i.e., when the operation-state switching-unit 18 is operating in the preventing state, the detection signal substantially includes the residual contribution, i.e. the detection signal is substantially not caused by detected induced particles 22. The residual contribution decreases the accuracy of the detection signal and can vary over time causing a time varying accuracy of the detection signal. In order to account for the effects of the (time varying) residual contribution, the controller 21 is configured to adjust, based on the residual signal, the control value so that the residual signal takes a value within a pre-determined limited residual-signal target range.

In the example illustrated in FIGS. 2A and 2B, the signal processing unit 25 includes the amplifier 27 which amplifies the difference between the detection signal and the control value. Accordingly, by subtracting from the detection signal a value corresponding to the residual contribution or corresponding to time-varying changes of the residual contribution, the residual contribution or at least its time-varying changes can be accounted for, resulting in an increased accuracy of the detection signal. This can be accomplished by controlling the control value so that the residual signal is substantially constant in time, for example. This, in turn, can be realized by controlling the control value so that the residual signal takes a value within the residual-signal target range.

Having adjusted the control value as described with reference to FIG. 2B, the controller 21 can generate the result signal as illustrated in FIG. 2A and record data representing the result signal. Further, based on the recorded data, the controller 21 can generate an analysis result such as an image, energy spectrum and the like.

The controller 21 can be configured to control the operation-state switching-unit 18 to alternately operate in the allowing state and in the preventing state in order to repeatedly generate the result signal and the residual signal and to repeatedly adjust the control value based on the residual signal. Accordingly, the control value is repeatedly adjusted to account for (time-varying changes of) the residual contribution to the detection signal.

Figure 3:
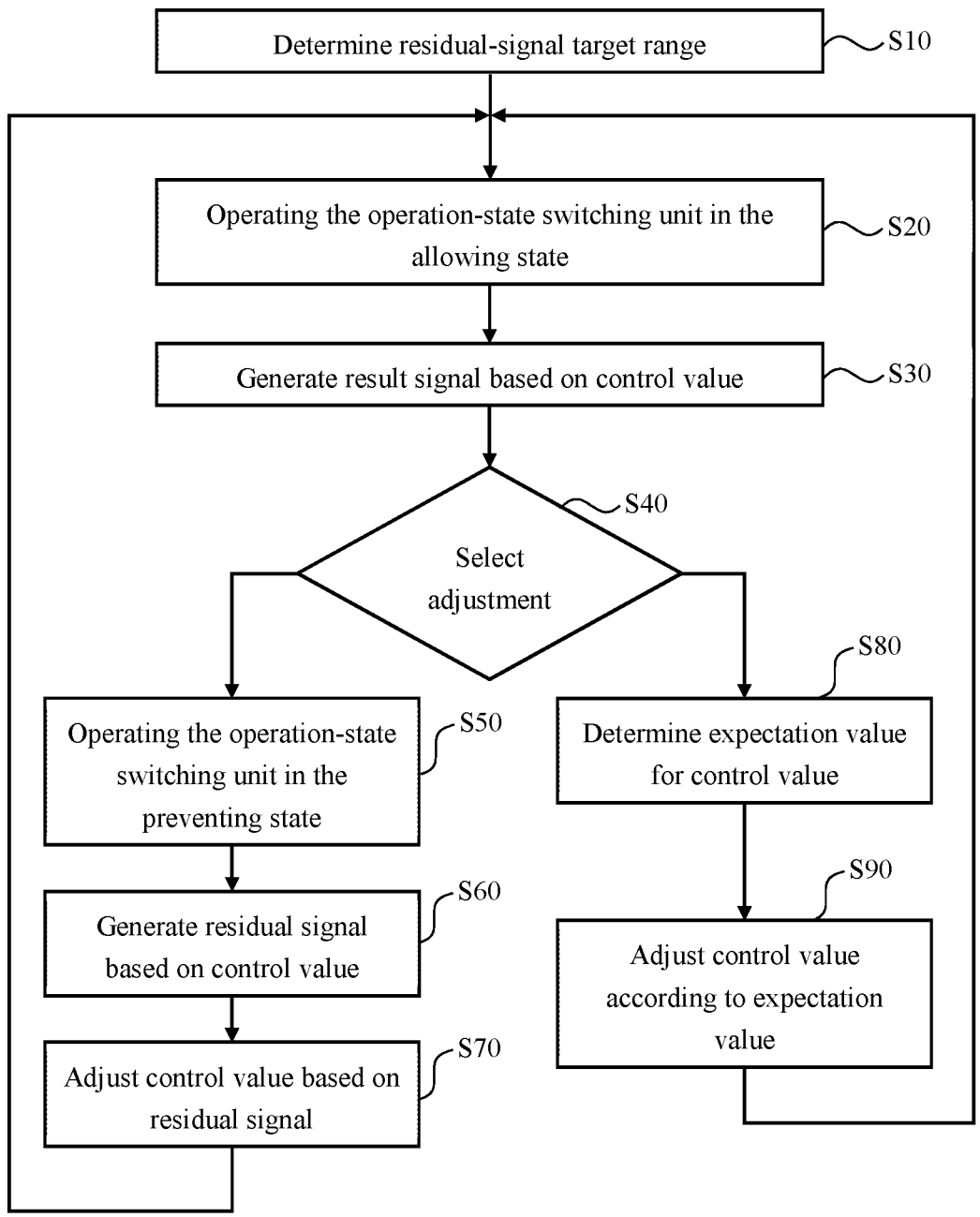
FIG. 3 shows a flow diagram of a method of operating a particle beam system.

FIG. 3 shows a flow diagram of a method of operating the particle beam system 1.

The method achieves the generating of the result signal while accounting for the residual contribution to the detection signal and time-varying changes of the residual contribution to the detection signal.

In step S10, the residual-signal target range is determined. The residual-signal target range is a limited range meaning that it includes values between a lower limit and an upper limit. The residual-signal target range can be arbitrarily set by an operator of the particle beam system performing the method. Alternatively, the residual-signal target range can be determined based on the residual signal as will be described with reference to FIG. 4 later. If desired, an initial control value can be provided in step S10.

In step S20 subsequent to step S10, the operation-state switching unit 18 is controlled to operate in the allowing state. For example, in the example illustrated in FIG. 1, the controller 21 can control the beam blanker, in particular the deflector 19, so that the primary particle beam 7 passes the opening in the aperture 20 so that the primary particle beam 7 generates the induced particles 22 emerging from the object 3, thereby allowing generation of the induced particles 22.

In step S30 subsequent to step S20, the result signal is generated based on the detection signal and the control value as illustrated in FIG. 2A. The result signal thus generated can be recorded.

In step S40 subsequent to step S30, a type of the adjustment of the control value is selected. For example, the controller 21 can be configured to select one of the two types of adjustments. A first type of adjustment includes the steps S50, S60 and S70. A second type of adjustment includes the steps S80 and S90. While the first type of adjustment involves interrupting the generating of the result signal in order to generate the residual signal, the second type of adjustment does not require interrupting the generating of the result signal.

The selection process performed in step S40 can be configured so that the first type of adjustment is performed after each recording of a specific amount of data. For example, the first type of adjustment can be performed after each recording of data representing a predetermined amount of image pixels or image lines or images. For example, the second type of adjustment can be performed during the recording of data. In general, the second type of adjustment can be performed in between multiple performances of the first type of adjustment. The selection process can be adapted according to the needs of the operator.

When the first type of adjustment is selected in step S40, steps S50 to S70 are subsequently performed. When the second type of adjustment is selected in step S40, the steps S80 and S90 are subsequently performed.

Next, the first type of adjustment is described.

In step S50 subsequent to step S40, the operation-state switching unit 18 is controlled to operate in the allowing state. In the example illustrated in FIG. 1, the controller 21 can control the beam blanker, in particular the deflector 19, to deflect the primary particle beam 7 so that the primary particle beam 7 does not pass the opening in the aperture 20 and is blocked by the aperture 20. Accordingly, induced particles 22 are not generated and therefore induced particles 22 are not incident on the detection area 24.

In step S60 subsequent to step S50, the residual signal is generated based on the detection signal and the control value. This can be achieved by the signal processing unit 25 as illustrated and described with reference to FIG. 2B.

In step S70 subsequent to step S60, the control value is adjusted based on the residual signal generated in step S60. This can be achieved by the controller 21 as illustrated and described with reference to FIG. 2B. In particular, the control value is adjusted based on the residual signal so that the residual signal takes a value within the residual-signal target range determined in step S10. Subsequent to step S70, the method repeats from step S20.

Next, the second type of adjustment is described.

In step S80 subsequent to step S40, an expectation value for the control value is determined. This can be achieved by the controller 21, for example. In particular, the expectation value can be determined based on an extrapolation of the residual signal(s) which were previously generated in step S10 (described later) and/or step S60. In addition or alternatively, the expectation value can be determined based on an extrapolation of control values which were previously determined in steps S10 (described later), S70 and/or S90.

In step S90 subsequent to step S80, the control value is adjusted according to the expectation value determined in step S80. This can be achieved by the controller 21.

The second type of adjustment allows to adjust the control value without operating the operation-state switching-unit 18 in the preventing state. This means that the steps S80 and S90 can be performed simultaneously with steps S20 and S30, i.e., simultaneously with generating the result signal. However, as the adjustment of the control value is based on previously determined data such as the previously generated residual signal and/or previously determined control values, the adjustment of the control value is accurate only for a limited amount of time due to the limited accuracy of the extrapolation. Therefore, it is advantageous to use both the first and the second type of adjustment.

As the second type of adjustment can be performed simultaneously with the steps S20 and S30, the control value can be adjusted according to the expectation value while the result signal is generated. This can be achieved by the controller adjusting the control value according to the expectation value while the signal processing unit 25 generates the result signal as illustrated in FIG. 2A.

While the second type of adjustment (steps S80 and S90) allows to simultaneously generate the result signal and to adjust the control value based on the expectation value, the first type of adjustment (steps S50 to S70) allows to alternately generate the result signal and to adjust the control value based on the residual signal.

Figure 4:
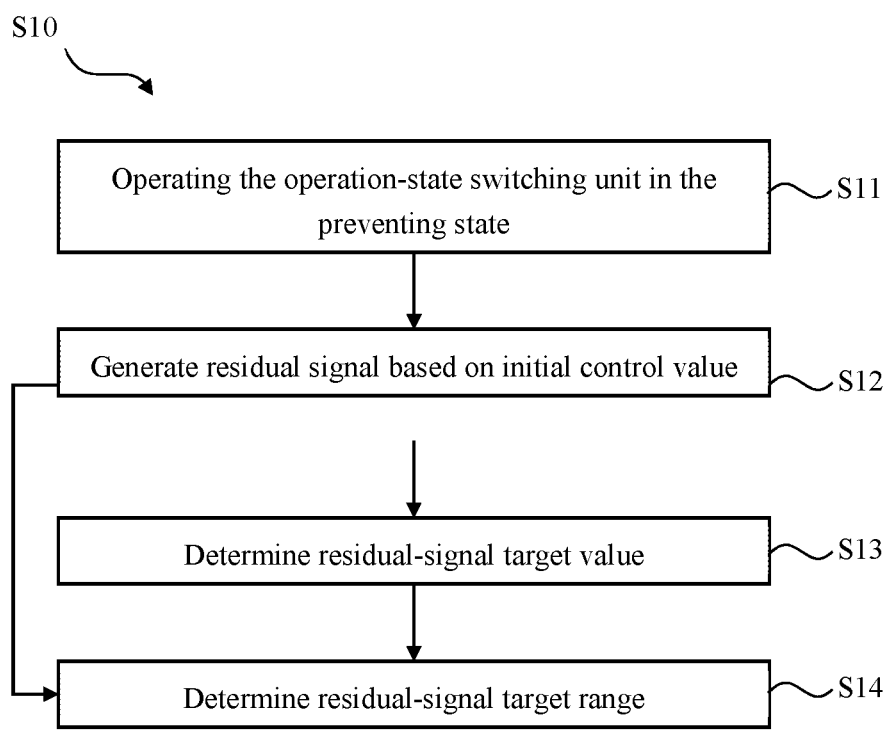
FIG. 4 shows a flow diagram of a method of determining a residual-signal target range.

FIG. 4 shows a flow diagram of a method of determining the residual-signal target range according to step S10. FIG. 4 illustrates the situation when the residual-signal target range is determined based on the residual signal. Step S10 including steps S11, S12, S13 and S14 can be performed prior to recording a series of images, for example.

In step S11, the operation-state switching unit 18 is controlled to operate in the allowing state. Step S11 can be identical to step S50, the description of which therefore also applies to step S11.

In step S12 subsequent to step S11, the residual signal is generated based on an initial control value and the detection signal. This can be achieved by the signal processing unit 25 as illustrated in FIG. 2B. The initial control value can be provided by the controller 21. Step S12 substantially corresponds to step S60, the description of which therefore substantially applies to step S12.

In step S13 subsequent to step S12, a residual-signal target value is determined. The residual-signal target value is determined based on the residual signal generated in step S12. The residual-signal target value can be determined by averaging the residual signal generated in step S12, for example. The residual-signal target value is a target value for the residual signal, i.e., the control value can be adjusted, based on the residual signal, so that the residual signal converges to the residual-signal target value. This can be achieved by the controller 21, for example, which can be configured to adjust, based on the residual signal, the control value so that the residual signal converges to the residual-signal target value.

Step S14 can be performed subsequent to step S13. In this case, the residual-signal target range is determined based on the residual-signal target value determined in step S13. For example, the residual-signal target range can be determined so that it includes the residual-signal target value. In particular, the residual-signal target range can be determined to amount to at least 50% of the residual-signal target value or at least 80% of the residual-signal target value, for example. Further, the upper limit can be determined to amount to at most 150% of the residual-signal target value or at most 120% of the residual-signal target value, for example.

Alternatively, step S14 can be performed immediately subsequent to step S12 omitting step S13. In this case, the residual-signal target range is determined based on the residual signal generated in step S12.

Figure 5:
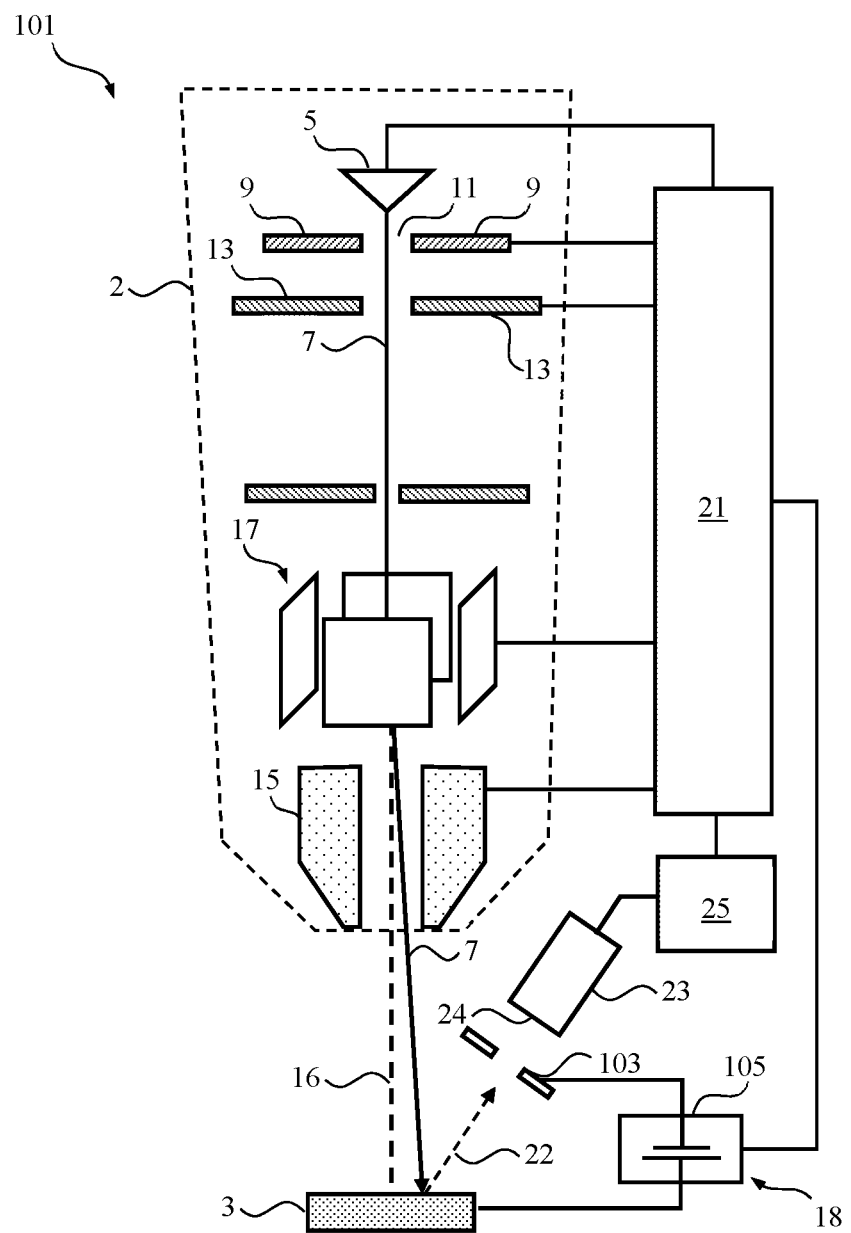
FIG. 5 shows a schematic illustration of a particle beam system according to a second embodiment.

FIG. 5 shows a schematic illustration of a particle beam system 101 according to a second embodiment. The particle beam system 101 substantially corresponds to the particle beam system 1 illustrated in FIG. 1, however, in contrast, the operation-state switching-unit 18 is exemplified by a field generator controlled by the controller 21 and configured to selectively generate and release a repulsive field in front of the detection area 24 of the detector 23. In the preventing state, the repulsive field is generated, thereby preventing incidence of the induced particles 22 onto the detection area 24. In the allowing state, the repulsive field is released (i.e. not generated), thereby allowing incidence of the induced particles 22 onto the detection area 24. As illustrated in FIG. 5, the field generator can be implemented by an aperture 103 and a voltage supply 105 connected to the object 3 and the aperture 103. The controller 21 is connected to the voltage supply 105 for controlling the voltage applied between the object 3 and the aperture 103.

Figure 6:
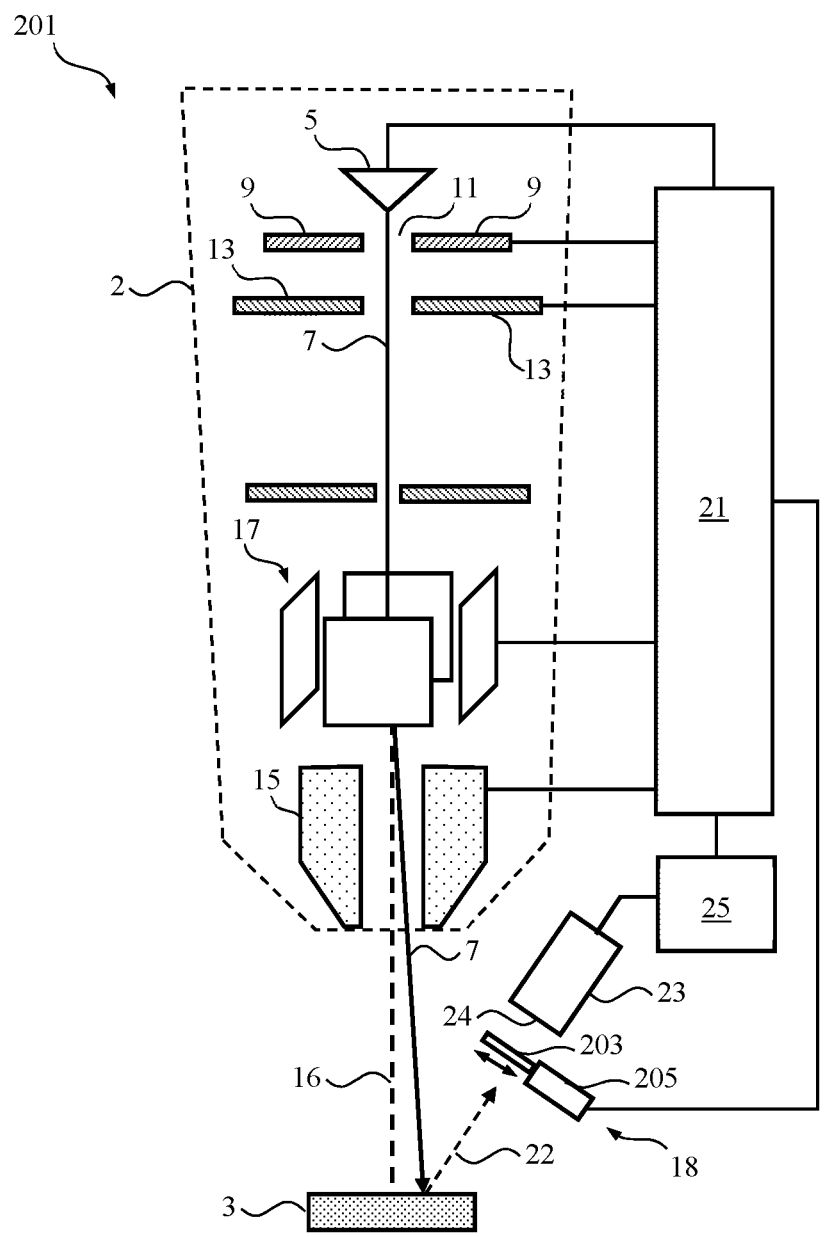
FIG. 6 shows a schematic illustration of a particle beam system according to a third embodiment.

FIG. 6 shows a schematic illustration of a particle beam system 201 according to a third embodiment. The particle beam system 101 substantially corresponds to the particle beam system 1 illustrated in FIG. 1, however, in contrast, the operation-state switching-unit 18 is exemplified by a shielding element 203 and an actuator 205 configured to move the shielding element 203 so as to selectively cover the detection area 24 with the shielding element 203 or uncover the detection area 24. In the preventing state, the shielding element 203 is disposed in front of the detection area 24, thereby preventing incidence of the induced particles 22 onto the detection area 24. In the allowing state, the shielding element 203 is not disposed in front of the detection area 24, thereby allowing incidence of the induced particles 22 onto the detection area 24. The controller 21 is connected to the actuator 205 for controlling the movement of the shielding element 203 by the actuator 205.

According to another embodiment, the operation-state switching-unit 18 can be configured to control generating of the primary particle beam 7, i.e. the operation-state switching-unit 18 controls the particle source 5 and/or the electric potential supplied to the suppression electrode 9. In this case, the operation-state switching-unit 18 can be implemented by the controller 21. In the allowing state, the operation-state switching-unit 18 controls the particle source 5 and/or the electric potential supplied to the suppression electrode 9 to generate the primary particle beam 7, thereby allowing generation of the induced particles 22 by the primary particle beam 7. In the preventing state, the operation-state switching-unit 18 controls the particle source 5 not to generate the primary particle beam 7 and/or controls the electric potential supplied to the suppression electrode 9 to prevent the primary particle beam 7 from passing the opening 11, thereby preventing generation of the induced particles 22.

According to another embodiment, the operation-state switching-unit 18 can be configured to control the position of the detector 23 and its detection area 24. For example, the operation-state switching-unit 18 can be configured to change the position/orientation of the detector 23 so that the detection area 24 can selectively be turned towards the induced particles 22, whereby the induced particles 22 can be incident onto the detection area 24, or be turned away from the induced particles 22, whereby incidence of the induced particles 22 onto the detection area 24 is sufficiently prevented. In this case, the operation-state switching-unit 18 can include an actuator configured to position the detector 23 accordingly.

While the disclosure has been described with respect to certain exemplary embodiments thereof, it is evident that many alternatives, modifications and variations will be apparent to those skilled in the art. Accordingly, the exemplary embodiments of the disclosure set forth herein are intended to be illustrative and not limiting in any way. Various changes may be made without departing from the spirit and scope of the present disclosure as defined in the following claims.

The invention claimed is:

1. A particle beam system, comprising:
a particle beam column configured to generate a primary particle beam and to scan the primary particle beam across an object region;
a detector configured to detect induced particles incident onto a detection area of the detector and to output a detection signal based on the detected induced particles;
an operation-state switching-unit configured to selectively operate in an allowing state and a preventing state;
a signal processing unit; and
a controller,
wherein:
when the operation-state switching-unit is in the allowing state, the operation-state switching unit is configured to allow generation of the induced particles by the primary particle beam and incidence of the induced particles onto the detection area;
when the operation-state switching-unit is in the preventing state, the operation-state switching unit is configured to prevent at least one member selected from the group consisting of generation of the induced particles and incidence of the induced particles onto the detection area;
the signal processing unit is configured to generate:
a result signal by processing, using a control value, the detection signal outputted while the operation-state switching-unit is operating in the allowing state; and
a residual signal by processing, using the control value, the detection signal outputted while the operation-state switching-unit is operating in the preventing state;
the controller is configured to:
control operation of the operation-state switching-unit and the signal processing unit;
record data representing the result signal; and
adjust, based on the residual signal, the control value so that the residual signal takes a value within a limited residual-signal target range.

2. The particle beam system of claim 1, wherein:
the signal processing unit is configured to generate the result signal and the residual signal based on an output of a difference calculation unit of the signal processing unit; and
the difference calculation unit is configured to output a difference between the detection signal and the control value.

3. The particle beam system of claim 1, wherein:
the signal processing unit is configured to generate the result signal and the residual signal based on an output of an amplifier of the signal processing unit; and
the amplifier is configured to output an amplified difference between the detection signal and the control value.

4. The particle beam system of claim 1, wherein:
the residual-signal target range include values between a lower limit and an upper limit and includes a residual-signal target value;
the lower limit amounts to at least 50% of the residual-signal target value, in particular at least 80% of the residual-signal target value; and
the upper limit amount to at most 150% of the residual-signal target value, in particular at most 120% of the residual-signal target value.

5. The particle beam system of claim 4, wherein the controller is further configured to determine the residual-signal target value based on the residual signal.

6. The particle beam system of claim 4, wherein the controller is configured to adjust the control value so that the residual signal converges to the residual-signal target value.

7. The particle beam system of claim 1, wherein the operation-state switching-unit is configured to perform at least one member selected from the group consisting of:
covering the detection area with a shielding element and uncovering the detection area;
generating and releasing a repulsive field in front of the detection area;
controlling generation of the primary particle beam by the particle beam column;
blanking and unblanking the primary particle beam; and
positioning the detector so that the detection area either is turned away from the induced particles or is turned towards the induced particles.

8. The particle beam system of claim 1, wherein the controller is further configured to:
determine an expectation value for the control value based on at least one of an extrapolation of the residual signal and an extrapolation of previously determined control values; and
adjust the control value according to the determined expectation value.

9. The particle beam system of claim 8, wherein the controller is configured to adjust the control value according to the determined expectation value while the signal processing unit generates the result signal.

10. The particle beam system of claim 1, wherein the signal processing unit is configured to generate the residual signal while the particle beam column generates the primary particle beam.

11. The particle beam system of claim 1, wherein the controller is further configured to alternately generate the result signal and adjust the control value based on the residual signal.

12. A method of operating a particle beam system, the method comprising:
preventing at least one member selected from the group consisting of: i) generation of induced particles; and ii) incidence of the induced particles onto a detection area of a detector configured to detect the induced particles and to output a detection signal based on the detected induced particles;
using a control value to generate a residual signal by processing the detection signal outputted during the preventing using a control value;
adjusting, based on the residual signal, the control value so that the residual signal takes a value within a limited residual-signal target range;
directing a primary particle beam onto an object while allowing generation of the induced particles due to the primary particle beam and incidence of the induced particles onto the detection area;

generating a result signal by processing the detection signal outputted during the directing using the control value; and recording data representing the result signal.

13. The method of claim 12, comprising generating the result signal and the residual signal based on a difference between the detection signal and the control value.

14. The method of claim 12, wherein:

the residual-signal target range includes values between a lower limit and an upper limit and includes a residual-signal target value;

the lower limit amounts to at least 50% of the residual-signal target value, in particular at least 80% of the residual-signal target value; and the upper limit amount to at most 150% of the residual-signal target value, in particular at most 120% of the residual-signal target value.

15. The method of claim 14, further comprising determining the residual-signal target value based on the residual signal.

16. The method of claim 14, comprising adjusting the control value so that the residual signal converges to the residual-signal target value.

17. The method of claim 12, comprising performing the preventing and allowing by at least one member selected from the group consisting of:

covering the detection area with a shielding element and uncovering the detection area;

generating and releasing a repulsive field in front of the detection area;

controlling generation of the primary particle beam by the particle beam column;

blanking and unblanking the primary particle beam; and facing the detection area away from the induced particles and facing the detection area towards the induced particles.

18. The method of claim 12, further comprising:

determining an expectation value for the control value based on at least one member selected from the group consisting of an extrapolation of the residual signal and an extrapolation of previously determined control values; and adjusting the control value according to the determined expectation value.

19. The method of claim 18, comprising adjusting the control according to the determined expectation value during the generating of the result signal.

20. The method of claim 12, comprising generating the residual signal while the particle beam column generates the primary particle beam.

21. The method of claim 12, further comprising alternately repeating a first sequence and a second sequence, wherein:

the first sequence comprises preventing, generating of residual signal and adjusting; and the second sequence comprises allowing, generating the result signal and recording.

* * * * *